United States Patent [19]
Lu et al.

[11] Patent Number: 6,064,223
[45] Date of Patent: May 16, 2000

[54] LOW LEAKAGE CIRCUIT CONFIGURATION FOR MOSFET CIRCUITS

[75] Inventors: Yi Lu, Hillsboro; Ian Young, Portland, both of Oreg.

[73] Assignee: Intel Corporation, Santa Clara, Calif.

[21] Appl. No.: 09/111,450

[22] Filed: Jul. 8, 1998

[51] Int. Cl.[7] .................................................. H03K 17/16
[52] U.S. Cl. ................................... 326/21; 326/34; 326/83
[58] Field of Search .............................. 326/21, 31, 34, 326/80, 81, 83, 86

[56] References Cited

U.S. PATENT DOCUMENTS

| | | | |
|---|---|---|---|
| 5,043,604 | 8/1991 | Komaki | 326/83 |
| 5,594,371 | 1/1997 | Dousaki | 326/83 |
| 5,801,548 | 9/1998 | Lee et al. | 326/86 |
| 5,864,506 | 1/1999 | Arcoleo et al. | 326/83 |
| 5,949,254 | 9/1999 | Keeth | 326/83 |

*Primary Examiner*—Jon Santamauro
*Assistant Examiner*—Don Phu Le
*Attorney, Agent, or Firm*—Raymond J. Werner

[57] ABSTRACT

A circuit configured with MOSFETs having a first range of subthreshold conduction, is provided with at least one switchable pathway between the circuit and a power or ground node, such that the switchable pathway is operable to substantially reduce leakage current through the circuit. In a further aspect of the present invention, the switchable pathway is a FET having substantially the same subthreshold conduction characteristics as the FETs in the circuit to which the switchable pathway is coupled, the FET being configured to be driven into both inversion and accumulation.

19 Claims, 4 Drawing Sheets

6,064,223

LOW LEAKAGE CIRCUIT CONFIGURATION FOR MOSFET CIRCUITS

BACKGROUND OF THE INVENTION

1. Field of the Invention

The invention relates to metal-oxide-semiconductor field effect transistor (MOSFET) circuit design and more particularly to circuit configurations for reducing leakage current pathways.

2. Background

Advances in semiconductor manufacturing technology have resulted in substantially reducing the physical dimensions of transistors such as MOSFETs. In turn this has led to ever-increasing numbers of these physically smaller transistors being incorporated into integrated circuits.

As MOSFET transistor geometries have shrunk, it has been necessary to reduce the thickness of the gate insulator layer in order to achieve the desired electrical characteristics from the smaller, typically submicron, transistors. However, reducing the thickness of the gate insulator has also required a reduction in the operating voltage of circuits built with these transistors. The reduced operating voltage is necessary to avoid having an electric field across the gate insulator large enough to damage the gate insulator and thereby create a malfunctioning device.

With continued reduction of power supply voltage for deep submicron MOSFET circuits, the threshold voltages of both n-channel field effect transistors (NFETs) and p-channel field effect transistors (PFETs) have to be reduced correspondingly in order to maintain acceptable current drive in these transistors.

Unfortunately, deep submicron FETs with threshold voltages on the order of a few tenths of a volt, tend to suffer from an undesirable amount of subthreshold leakage current.

What is needed are methods and circuits for reducing leakage current in MOSFET circuits.

SUMMARY OF THE INVENTION

Briefly, a MOSFET circuit configured with transistors having a first range of subthreshold conduction, are provided with at least one switchable pathway between the MOSFET circuit and a power or ground node, such that the switchable pathway is operable to substantially reduce leakage current through the circuit.

In a further aspect of the present invention, the switchable pathway is a FET having substantially the same subthreshold conduction characteristics as the FETs in the circuit to which the switchable pathway is coupled, the FET being configured to be driven into inversion and accumulation.

DETAILED DESCRIPTION

Overview

In order to reduce power consumption when circuits are not in use, many modern integrated circuits use a standby mode in which a circuit is disabled from drawing current from a power supply. Unfortunately, deep submicron, low threshold voltage FETs, as conventionally configured and operated, are typically too leaky to effectively decouple a circuit from its power supply nodes, and therefore an undesirable amount of leakage current flows in standby mode.

Leakage currents typically associated with submicron, low threshold voltage FETs, can be reduced in embodiments of the present invention wherein the connections to power and/or ground nodes are effectively cut off. More particularly, embodiments of the present invention use one or more FETs coupled in series between a circuit block, also referred to as a subcircuit, and one or more power supply nodes, to cut off the pathway between power, the circuit block, and ground, by driving the one or more FETs into accumulation when switching current is not required by the circuit block.

Terminology

The terms, chip, integrated circuit, monolithic device, semiconductor device, and microelectronic device, are often used interchangeably in this field. The present invention is applicable to all the above as they are generally understood in the field.

The term "gate" is context sensitive and can be used in two ways when describing integrated circuits. As used herein, gate refers to a circuit for realizing an arbitrary logical function when used in the context of a logic gate. Gate refers to the insulated gate terminal of a three terminal FET when used in the context of transistor circuit configuration. Although a FET can be viewed as a four terminal device when the semiconductor body is considered, for the purpose of describing illustrative embodiments of the present invention, the FET will be described using the traditional gate-drain-source, three terminal model.

Circuit Configuration

Figure 1:
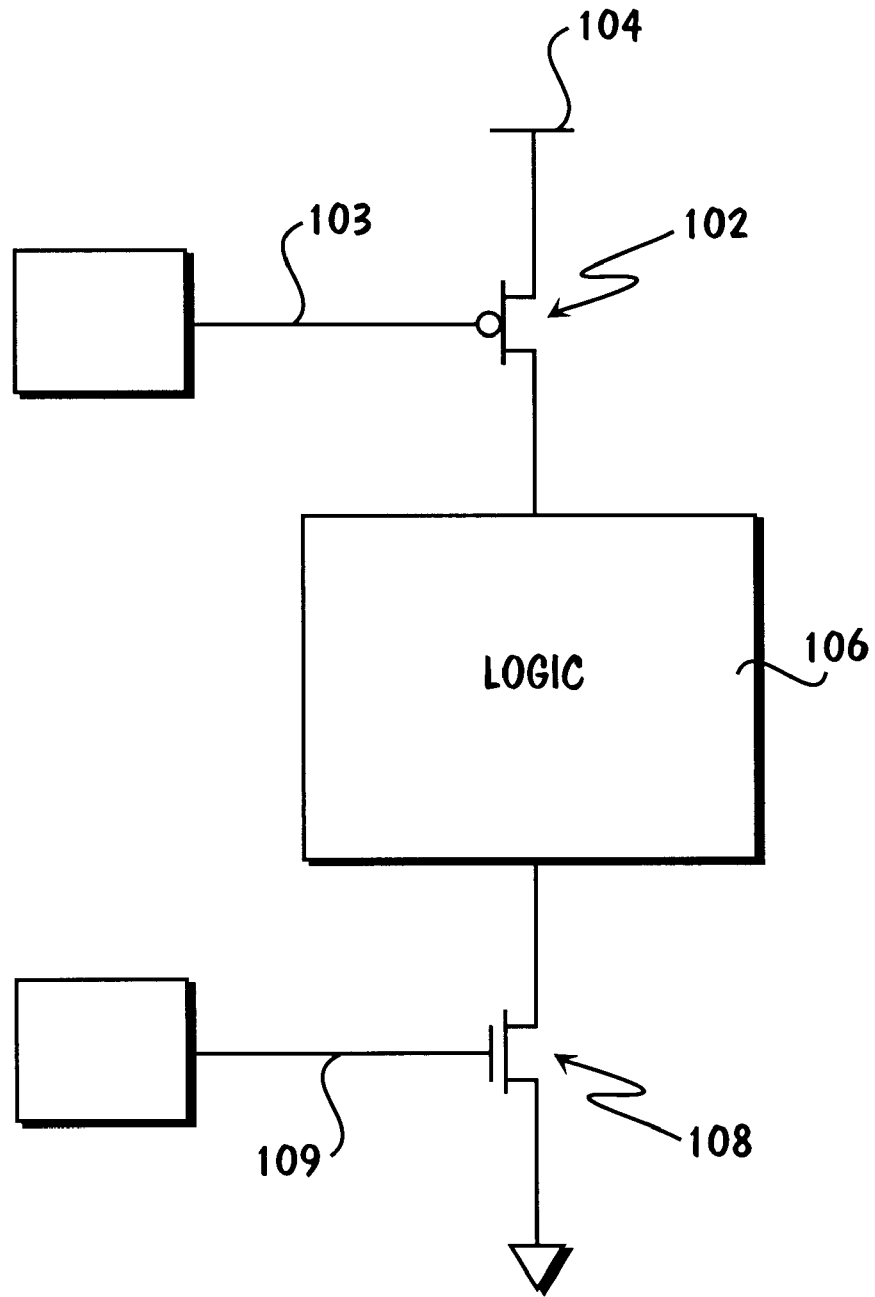
FIG. 1 is a schematic diagram showing a logic block, or subcircuit, having a first switchable pathway coupled between a first power supply node and the block and a second switchable pathway coupled between the block and a second power supply node.

Referring to FIG. 1, an illustrative embodiment of the present invention is shown wherein a PFET 102 is coupled source-to-drain between a first power supply node 104 and a circuit 106. Circuit 106 may be referred to as a subcircuit in the context of the larger circuit shown in the figure, since it is an identifiable subunit of the larger circuit. PFET 102 includes a gate terminal 103. Circuit 106 is further coupled to an NFET 108 that is coupled drain-to-source between circuit 106 and ground. NFET 108 includes a gate terminal 109. Gate terminal 103 is coupled to a driving circuit that is configured to drive the voltage at gate terminal 103 between ground, and a voltage that is higher than that found at first power supply node 104. Gate terminal 109 is coupled to a driving circuit that is configured to drive the voltage at gate terminal 109 between a voltage that is found at first power supply node 104, and a voltage that is lower than ground.

Figure 2:
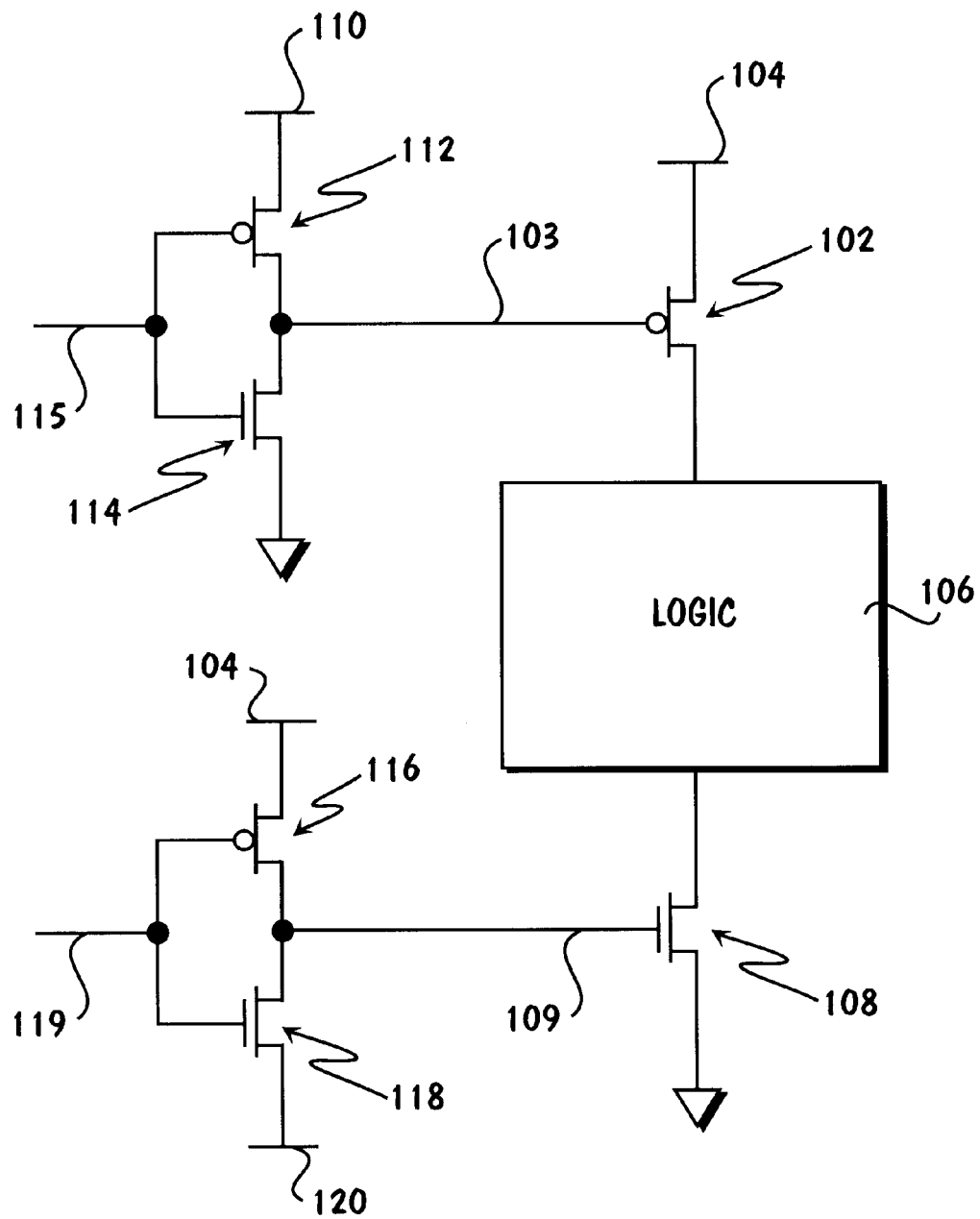
FIG. 2 is a schematic diagram showing the circuit of FIG. 1, with an illustrative circuit configuration interconnecting the switchable pathways to power supply nodes other than the power supply nodes interconnected with the block.

FIG. 2 shows the embodiment of FIG. 1, with illustrative examples of driving circuits in accordance with the present invention. As shown in FIG. 2, PFET 112 and NFET 114 are coupled to form a first inverter, and PFET 116 and NFET 118 are coupled to form a second inverter. Although inverters are shown in FIG. 2, those skilled in the art, and having the benefit of this disclosure, will recognize that other circuits could be used. For example, gates, including but not limited to, NOR gates or NAND gates could be used to logically determine when standby mode is to be entered as well as to switch between the voltages appropriate for driving the gate terminals of the FETs used as switchable pathways.

Similarly, FETs configured in a multiplexer arrangement, sometimes referred to as a transmission gate, can be used to couple the gate terminal of a FET used as switchable pathway to various power supply nodes.

More particularly, PFET 112 is coupled source-to-drain between a second power supply node 110 and gate terminal 103, and NFET 114 is coupled drain-to-source between gate terminal 103 and ground. The gates of PFET 112 and NFET 114 are coupled in common to a control signal 115. Similarly, PFET 116 is coupled source-to-drain between a first power supply node 104 and gate terminal 109, and NFET 118 is coupled drain-to-source between gate terminal 109 and a third power supply node 120. The gates of PFET 116 and NFET 118 are coupled in common to a control signal 119.

Second power supply node 110 is characterized as having a voltage that is higher, i.e., more positive, than the voltage found at first power supply node 104. In the illustrative embodiment second power supply node 110 is approximately 0.3 volts more positive than first power supply node 104. Third power supply node 120 is characterized as having a voltage that is lower, i.e., more negative, than ground. In the illustrative embodiment third power supply node 120 is approximately 0.3 volts less than ground.

Figure 3:
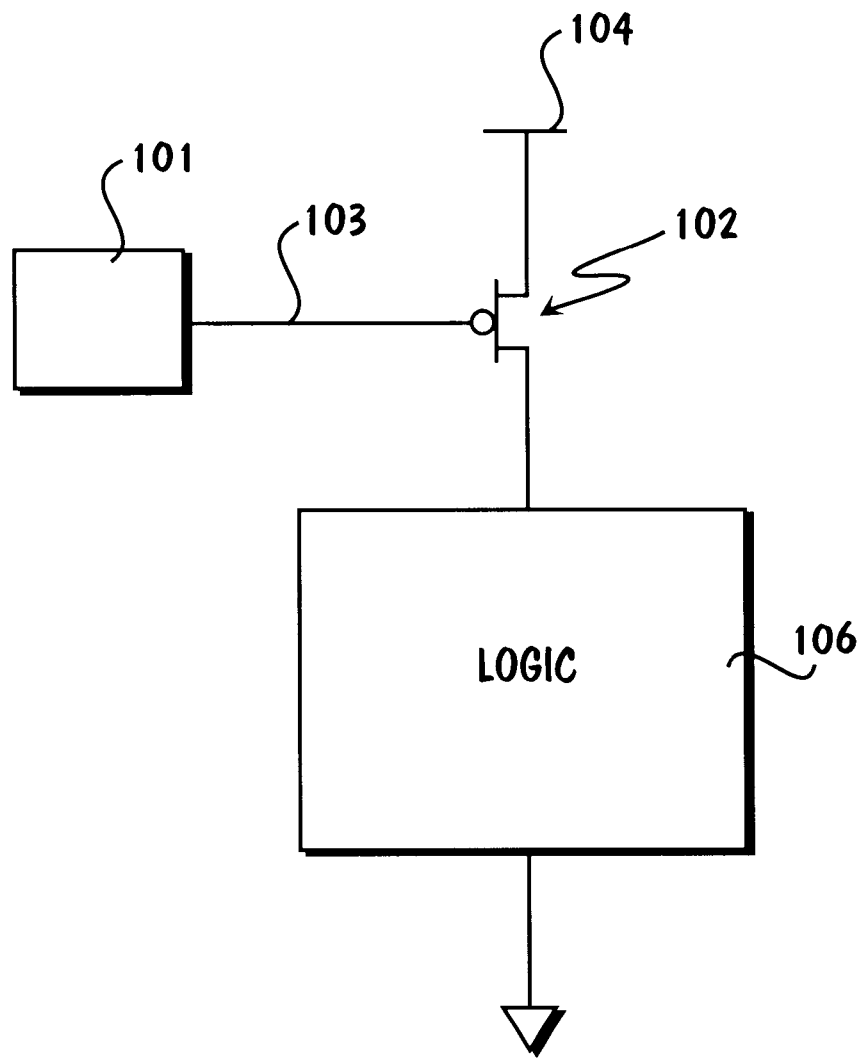
FIG. 3 schematic diagram showing a logic block, or subcircuit, having a PFET as a switchable pathway coupled between the block and a first voltage supply node.
Figure 4:
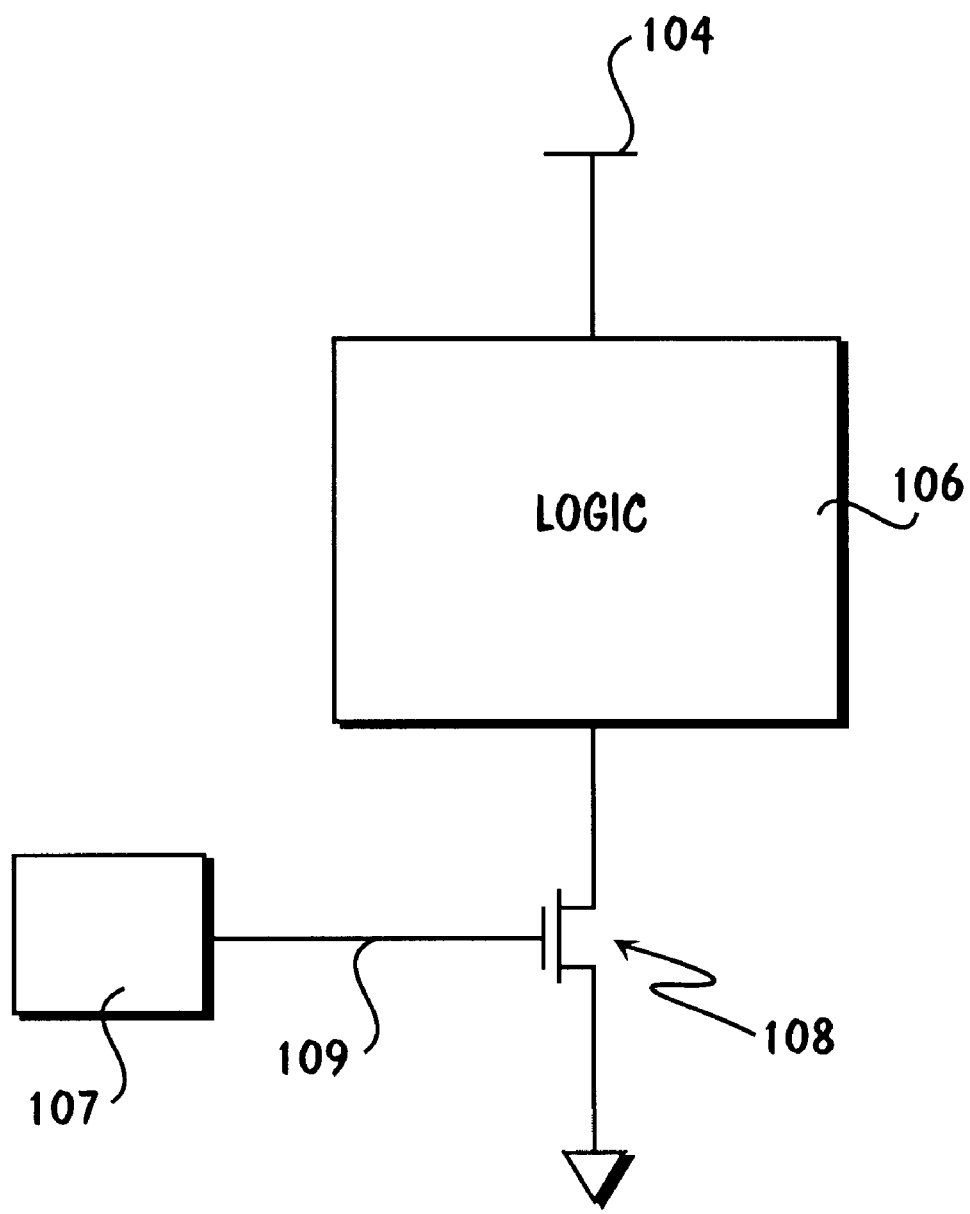
FIG. 4 schematic diagram showing a logic block, or subcircuit, having an NFET as a switchable pathway coupled between the block and a second voltage supply node.

Alternative embodiments of the present invention are shown in FIGS. 3–4. In FIG. 3, circuit block 106 is coupled to first power supply node 104 through a switchable pathway in the form of PFET 102. PFET 102 has a gate terminal 103. Gate terminal 103 is coupled to a driver 101 operable to create, at least, a positive value for the gate-to-source voltage, Vgs, that is applied to gate terminal 103. In FIG. 4, circuit block 106 is directly coupled to first power supply node 104, and is further coupled to ground through a switchable pathway in the form of NFET 108. NFET 108 has a gate terminal 109. Gate terminal 109 is coupled to a driver 107 operable to create, at least, a negative value for the gate-to-source voltage, Vgs, that is applied to gate terminal 109.

Circuit Operation

The operation of an illustrative embodiment of the present invention can be described with reference to FIG. 2. Circuit block 106 can be operated in a standby mode, and a normal mode. In the normal mode circuit block 106 performs the function for which it has been designed. It may be a static logic gate, a dynamic logic gate, a domino circuit, or any other type of circuit including, but not limited to a simple gate and a complex logic function. The normal mode functionality is enabled when circuit block 106 is coupled to both first power supply node 104 and ground. Coupling of circuit block 106 to first power supply node 104 and ground is accomplished through switchable pathways, implemented respectively, as PFET 102 and NFET 108.

Those skilled in the art will recognize that PFETs and NFETs are voltage controlled devices. Driver circuits are used to provide control signals to the gate terminals of PFET 102 and NFET 108. In normal mode, gate terminal 103 of PFET 102 is driven to a voltage substantially equal to the ground potential. In this way PFET 102 is turned on and current is enabled to flow from first power supply node 102 to circuit block 106. Similarly, in normal mode, gate terminal 109 of NFET 108 is driven to a voltage substantially equal to the voltage found at first power supply node 104. In this way NFET 108 is turned on and current is enabled to flow from circuit block 106 to ground.

In the embodiment of the present invention illustrated in FIG. 2, both the pathway from first power supply node 104 to circuit block 106, and the pathway from circuit block 106 to ground can be cut off in order to reduce the leakage current from first power supply node 104 to ground. To cut off the pathway from first power supply node 104 to circuit block 106, gate terminal 103 of PFET 102 is driven to a voltage that is higher than the voltage at first power supply node 104. This is typically done by connecting gate terminal 103 to a logic gate having an output that switches between ground and second power supply node 110. When the logic gate switches its output, and therefore also gate terminal 103, to second power supply node 110, the gate-to-source voltage Vgs of PFET 102 becomes a positive value greater than zero. By applying a positive Vgs greater than zero to gate terminal 103 of PFET 102, it is possible to substantially reduce the subthreshold conduction as compared to the magnitude of subthreshold conduction at Vgs equal to zero or less. In accordance with the present invention, to substantially cut off current flow from first power supply node 104 to circuit block 106, gate terminal 103 of PFET 102 is driven to a voltage that is higher than the source voltage of PFET 102. In this way PFET 102 can be driven into the accumulation mode of FET operation. Those skilled in the art and having the benefit of this disclosure will recognize that the amount by which the voltage at gate terminal 103 is designed to exceed the source voltage of PFET 102 may vary with a number of parameters including but not limited to PFET threshold voltage, and PFET subthreshold conduction characteristics.

The pathway from circuit block 106 to ground is cut off in a manner analogous to that described immediately above. More particularly, to cut off the pathway from circuit block 106 to ground, gate terminal 109 of NFET 108 is driven to a voltage that is lower than the ground potential. This is typically done by connecting gate terminal 109 to a logic gate having an output that switches between first power supply node 104 and third power supply node 120. When the logic gate switches its output, and therefore also gate terminal 109, to third power supply node 120, the gate-to-source voltage Vgs of NFET 108 becomes a negative value. By applying a negative Vgs to gate terminal 109 of NFET 108, it is possible to substantially reduce the subthreshold conduction as compared to the magnitude of subthreshold conduction at Vgs equal to or greater than zero. In accordance with the present invention, to substantially cut off current flow from circuit block 106 to ground, gate terminal 109 of NFET 108 is driven to a voltage that is lower than the source voltage of NFET 108. In this way NFET 108 can be driven into the accumulation mode of FET operation. Those skilled in the art and having the benefit of this disclosure will recognize that the amount by which the voltage at gate terminal 109 is designed to be less than the source voltage of NFET 108 may vary with a number of parameters including but not limited to NFET threshold voltage, and NFET subthreshold conduction characteristics.

The voltage at second power supply node 110 can be supplied from a power supply that is external to the integrated circuit or may be generated on-chip by, for example, a bias generator, also known as a charge pump. The voltage at third power supply node 120 can be supplied from a power supply that is external to the integrated or may be generated on-chip by, for example, a bias generator, also known as a charge pump. Those skilled in the art and having the benefit of this disclosure will recognize the trade-offs involved in choosing the external versus internal voltage sources. Exemplary trade-offs include, but are not limited to, additional external connections required for external voltage sources and no voltage generation circuitry on-chip, versus additional chip area required for voltage generation circuitry and no additional external connections required.

When using a configuration that includes connections to externally supplied voltages, a user may choose simply to connect first power supply node 104 in parallel with second power supply node 10, and to connect third power supply node in parallel with ground. When connected in this way, circuit block 106 functions as intended in normal mode, and in standby mode experiences a higher level of leakage current than when second and third power supply nodes 110, 120 are connected to the appropriate voltage levels. Therefore providing external connections for second and third power supply nodes 110, 120 allows a user to make the trade-off between having additional power supplies in a system versus having lower power consumption in an integrated circuit during standby mode.

As can be seen from the circuit configurations shown FIGS. 3–4, embodiments of the present invention may be operated with one switchable pathway in series with circuit block 106 rather than the two switchable pathways illustrated in the embodiment of FIG. 2.

Conclusion

Embodiments of the present invention provide methods and circuits for reducing undesired leakage currents. In illustrative embodiments of the invention, FETs are introduced in a serial fashion between power and/or ground terminals of circuitry and the power and/or ground nodes respectively. In other words, the connection between circuitry and the power rails can be cut off by controlling the FETs configured serially between the circuitry and the power rails. These FETs are driven into accumulation when it is desired to cut off the circuitry from the power and/or ground nodes. In this way the current source and/or sink is effectively disconnected from circuitry that is implemented with transistors that having undesirably high subthreshold conduction.

An advantage of embodiments of the present invention is that power consumption due to subthreshold leakage current is reduced.

An advantage of embodiments of the present invention is reduction of power consumption due to subthreshold conduction without having to use longer FET channel lengths.

An advantage of embodiments of the present invention is that additional masking and ion implant operations, required for creating multiple FET threshold voltages, are avoided.

A further advantage of the present invention is that leakage current is reduced without modulation of FET body voltages.

It will be understood by those skilled in the art having the benefit of this disclosure, that many design choices are possible within the scope of the present invention. Examples of such design choices include but are not limited to, the conditions under which a standby, or low power mode is entered; the magnitude of the voltage differences between the various power supply nodes; and the functionality of the circuit block that is cut off from the power and/or ground nodes during a low power mode of operation.

It will be understood that various other changes in the details, materials, and arrangements of the parts and operations which have been described and illustrated may be made by those skilled in the art, and having the benefit of this disclosure, without departing from the principles and scope of the invention as expressed in the subjoined claims.

What is claimed is:

1. A circuit, comprising:
   a subcircuit;
   a first switchable path coupled between a first power supply node and the subcircuit, the first switchable path having a first control input terminal;
   a second switchable path coupled between the subcircuit and a second power supply node, the second switchable path having a second control input terminal;
   wherein the first control input terminal is configured to receive a signal having a voltage that ranges between the voltage of the second power supply node and a voltage higher than the first power supply node, and the second control input terminal is configured to receive a signal having a voltage that ranges between a voltage lower than that of the second power supply node and the voltage of the first power supply node; and
   wherein the first switchable path comprises a PFET and the second switchable path comprises an NFET, and wherein the voltage that is higher than the first power supply voltage is approximately equal to the voltage required to drive the PFET into accumulation, and the voltage that is lower than the second power supply voltage is approximately equal to the voltage required to drive the NFET into accumulation.

2. The circuit of claim 1, wherein the voltage that is lower than the second power supply voltage is approximately 0.3 volts lower.

3. The circuit of claim 1, wherein the voltage that is higher than the first power supply is approximately 0.3 volts higher.

4. A method of operating a subcircuit, comprising:
   driving a PFET, coupled source-to-drain between a power supply node and the subcircuit, into inversion;
   performing a function; and
   driving the PFET into accumulation.

5. A method of operating a subcircuit, comprising
   driving an NFET, coupled drain-to-source between the subcircuit and a ground node, into inversion;
   performing a function; and
   driving the NFET into accumulation.

6. A circuit comprising:
   a first driver coupled between a first power supply node and a second power supply node, the first driver having an output terminal;
   a second driver coupled between a third power supply node and a fourth power supply node, the second driver having an output terminal;
   a subcircuit;
   a first switchable path coupled between the third power supply node and the subcircuit, the first switchable path having a first control input terminal;
   a second switchable path coupled between the subcircuit and the second power supply node, the second switchable path having a second control input terminal;
   wherein the first driver output terminal is coupled to the first control input terminal, and the second driver output terminal is coupled to the second control input.

7. The circuit of claim 6, wherein the first switchable path and the second switchable path are both FETs.

8. The circuit of claim 6, wherein the first switchable path is a PFET and the second switchable path is an NFET.

9. The circuit of claim 6, wherein the first driver circuit is a logic gate.

10. The circuit of claim 6, wherein the second driver circuit is a logic gate.

11. The circuit of claim 8, wherein the first power supply node has a first voltage, the third power supply node has a second voltage; the first voltage being greater than second voltage.

12. The circuit of claim 8, wherein the second power supply node has a first voltage, the fourth power supply node has a second voltage; the first voltage being greater than second voltage.

13. The circuit of claim 12, wherein the first driver is an inverting logic gate.

14. The circuit of claim 12, wherein the first driver is an inverter.

15. The circuit of claim 13, wherein the subcircuit is configured to realize a logical function.

16. The circuit of claim 13, wherein the first power supply node has a positive voltage and the second power supply node is at a ground potential.

17. The circuit of claim 13, further comprising a second FET coupled between the second power supply terminal and a second power supply node, wherein the second FET is configured to operate in both accumulation and inversion.

18. A circuit comprising:

a first driver coupled between a first power supply node and a second power supply node, the first driver having an output terminal;

a second driver coupled between a third power supply node and a fourth power supply node, the second driver having an output terminal;

a subcircuit;

a PFET coupled source-to-drain between the third power supply node and the subcircuit, and having a gate coupled to the first driver output terminal and;

an NFET coupled drain-to-source between the subcircuit and the second power supply node, and having a gate coupled to the second driver output terminal.

19. A circuit comprising:

a subcircuit having a first power supply terminal and a second power supply terminal; and a first FET coupled between a first power supply node and a first power supply terminal;

wherein the first FET is configured to operate in both accumulation and inversion.

* * * * *

UNITED STATES PATENT AND TRADEMARK OFFICE
CERTIFICATE OF CORRECTION

PATENT NO.    : 6,064,223
DATED         : May 16, 2000
INVENTOR(S)   : Lu et al.

It is certified that error appears in the above-identified patent and that said Letters Patent is hereby corrected as shown below:

Column 5,
Line 4, delete "10", insert -- 110 --.

Signed and Sealed this

Third Day of September, 2002

Attest:

Attesting Officer

JAMES E. ROGAN
Director of the United States Patent and Trademark Office